United States Patent [19]
Ryat

[11] Patent Number: 5,471,132
[45] Date of Patent: Nov. 28, 1995

[54] LOGARITHMIC AND EXPONENTIAL CONVERTER CIRCUITS

[75] Inventor: Marc H. Ryat, Santa Clara, Calif.

[73] Assignee: SGS-Thomson Microelectronics, Inc., Carrollton, Tex.

[21] Appl. No.: 70,276

[22] Filed: Jun. 1, 1993

Related U.S. Application Data

[63] Continuation-in-part of Ser. No. 70,274, Oct. 1, 1993, which is a continuation-in-part of Ser. No. 31,647, Mar. 15, 1993, which is a continuation-in-part of Ser. No. 950,091, Sep. 23, 1992, abandoned.

[30] Foreign Application Priority Data

Sep. 30, 1991 [FR] France ................................ 91 12278

[51] Int. Cl.$^6$ ....................................................... G05F 3/26
[52] U.S. Cl. ............................................. 323/315; 327/350
[58] Field of Search .................................... 323/312, 313, 323/315, 316, 317, 281; 363/73; 327/334, 362, 350; 330/288, 277

[56] References Cited

U.S. PATENT DOCUMENTS

| | | | |
|---|---|---|---|
| 4,004,247 | 1/1977 | Van de Plassche | 330/30 D |
| 4,703,249 | 10/1987 | De La Plaza et al. | 323/316 |
| 4,733,196 | 3/1988 | Menniti et al. | 330/288 |
| 4,740,766 | 4/1988 | Metz | 323/316 |
| 4,952,866 | 8/1990 | Van Tuijl | 323/315 |
| 4,970,452 | 11/1990 | Barbu et al. | 323/317 |
| 4,980,584 | 12/1990 | Goff et al. | 307/492 |
| 4,990,803 | 2/1991 | Gilbert | 307/492 |
| 4,990,864 | 2/1991 | Kwan | 330/256 X |
| 5,038,053 | 8/1991 | Djenquerian et al. | 307/310 |
| 5,057,717 | 10/1991 | Kimura | 307/492 |
| 5,173,656 | 12/1992 | Seevinck et al. | 323/314 |

OTHER PUBLICATIONS

Barber et al., "A True Logarithmic Amplifier for Radar IF Applications", *IEEE Jou. Solid–State Cir.* vol. SC–15, No. 3, Jun. 1980, p. 291.

Kimura, "A CMOS Logarithmic IF Amplifier with Unbalanced Source–Coupled Pairs", *IEEE Jou. Solid–State Cir.*, vol. 28, No. 1, Jan. 1993, p. 78.

Huijsing et al., "A Monolithic Analog Exponential Converter", *IEEE Jou. Solid–State Circuits*, vol. SC–15, No. 2, Apr. 1980, p. 162 *Amplifier Applications Guide*, Analog Devices, 1992, pp. IX–71–X–4.

Wassenaar et al., "New Techniques For High–Frequency RMS to DC Conversion Based on a Multi–Functional V–to–I Convertor", *IEEE Jou. Solid–State Cir.* vol. 23, No. 3, Jun. 1988.

*Primary Examiner*—Peter S. Wong
*Assistant Examiner*—Adolf Berhane
*Attorney, Agent, or Firm*—Richard A. Bachand; Lisa K. Jorgenson; Richard K. Robinson

[57] ABSTRACT

A logarithmic amplifier has first and second mirror circuits, each having active transistors interconnected by a resistor. The current input is applied within one of the mirror circuits so that a logarithmic function thereof is generated for output by an output current mirror circuit. The mirror circuits are similarly constructed with an active transistor, a cascode transistor, and a base current compensating transistor. The cascode and active transistors are connected in series between an input node and a reference potential, or ground, with the base current compensating transistor connected between a supply voltage source and a base of the active transistor. The base of the base current compensating transistor is connected to the reference current input node. Through modification of the basic circuit by injection of an input current to the active transistor with respect to the reference potential, an exponential converter is presented.

20 Claims, 2 Drawing Sheets

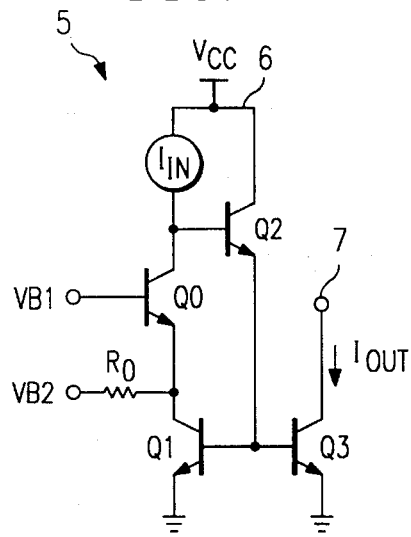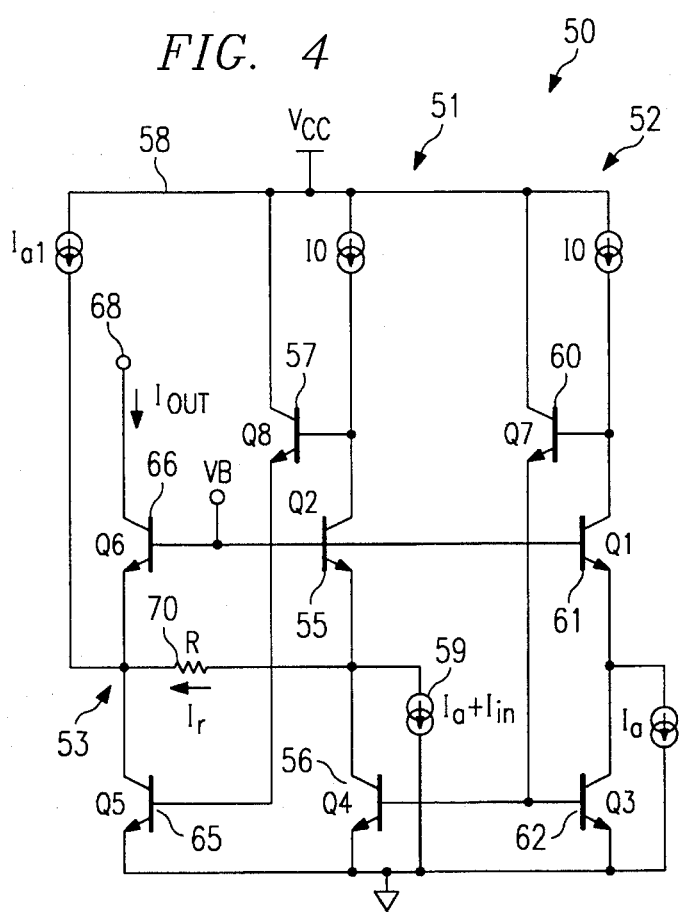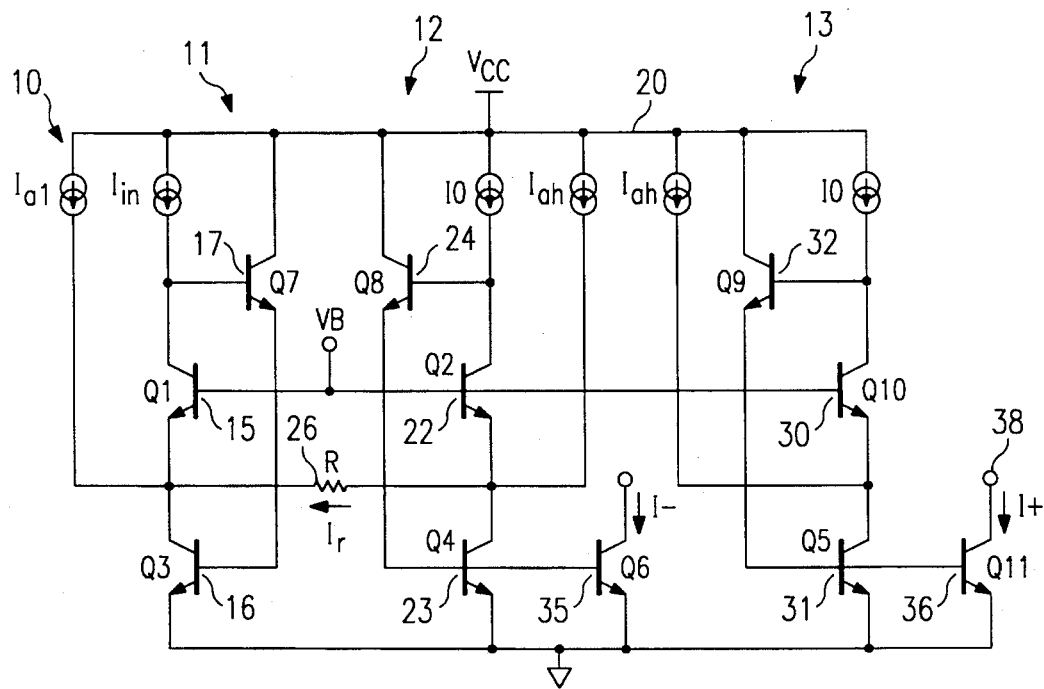

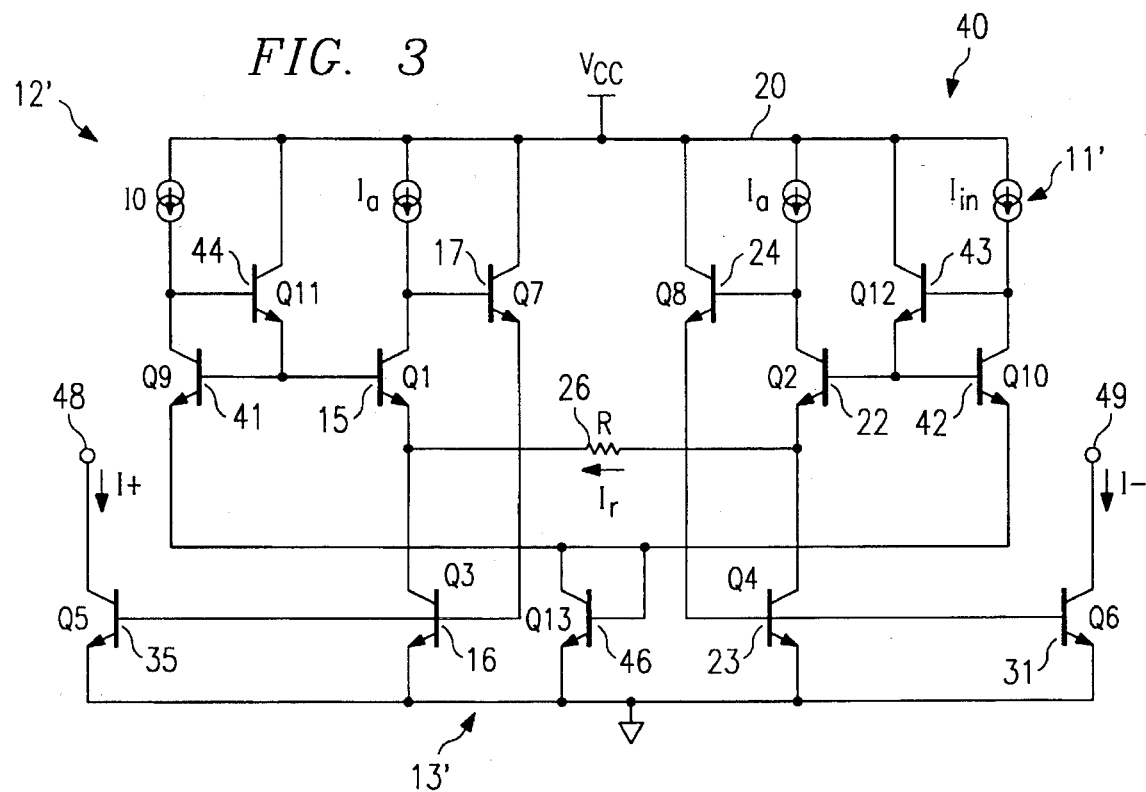

LOGARITHMIC AND EXPONENTIAL CONVERTER CIRCUITS

CROSS-REFERENCE TO RELATED APPLICATIONS

This application is a continuation-in-part of U.S. patent application Ser. No. 08/070,274, filed Jun. 1, 1993, entitled "Wideband Linear And Logarithmic Signal Conversion Circuits", said application being a continuation-in-part of U.S. patent application Ser. No. 08/031,647, filed Mar. 15, 1993, entitled "Linear Transconductors", said application being a continuation-in-part of U.S. patent application Ser. No. 07/950,091, filed Sep. 23, 1992, now abandoned, entitled "A Precise Current Generator", by applicant herein, which claims priority from French Application 91/12278, filed Sep. 30, 1991, by applicant herein, all of which are incorporated herein by reference.

BACKGROUND OF THE INVENTION

1. Field of the Invention

This invention relates to improvements in logarithmic amplifier circuits, and more particularly to improvements in quasi-open-loop logarithmic amplifiers that may be compensated for temperature changes and can perform true logarithmic amplification and exponential conversions.

2. Relevant Art

In the past, circuits used for logarithmic or exponential conversion of a signal were built from operational amplifiers in closed-loop structures, or derived from progressive compression techniques as cascades of open-loop gain stages. The closed-loop operational amplifier (the so-called "Patterson" or "transdiode" log amp) approach were typically slow, and the associated transfer function displayed an undesired temperature dependence and limited output voltage swing.

The progressive log amps alleviated these drawbacks at the cost of considerable circuit complexity and size, did not provide true logarithmic conversion, and, like the operational amplifier based circuits, were not easily adaptable to exponential conversion.

SUMMARY OF THE INVENTION

In light of the above, it is, therefore, an object of the invention to provide an improved signal conversion circuit.

It is still another object of the invention to provide a signal conversion circuit of the type described that can be constructed entirely of NPN transistors and can achieve fast operation with quasi-open-loop structures.

It is still another object of the invention to provide a signal conversion circuit of the type described that requires no compensation capacitors, and few components, enabling simple and compact structures to be achieved in integrated circuits or the like.

It is still another object of the invention to provide an improved signal conversion circuit of the type described in which the outputs are essentially independent of the beta of the transistors used, resulting in predictable temperature behavior.

It is still another object of the invention to provide a signal conversion circuit of the type described that can operate with low supply voltages and can accurately convert low input signal levels.

It is yet another object of the invention to provide a signal conversion circuit of the type described that can operate over a wide frequency band.

It is another object of the invention to provide an improved amplifier circuit for performing logarithmic amplification or exponential signal conversion.

It is an object of the invention to provide an amplifier of the type described that can be easily temperature stabilized by a compensation circuit connected in series with its input or output.

It is still another object of the invention to provide an amplifier circuit of the type described that achieves true logarithmic conversion, as opposed to progressive compression techniques used heretofore, with single or differential outputs.

It is yet another object of the invention to provide an improved circuit of the type described that has compatibility with current-mode as well as voltage-mode signal conversion.

It is yet another object of the invention to provide an improved circuit of the type described that performs accurate exponential conversion with a differential or a single-ended input.

It is yet another object of the invention to provide an improved circuit of the type described that can be used in fast computational circuits, and in applications requiring fast and accurate signal compression or expansion.

These and other objects, features and advantages of the invention will be apparent to those skilled in the art from the following detailed description of the invention, when read in conjunction with the accompanying drawings and appended claims.

In accordance with a broad aspect of the invention, a logarithmic amplifier is presented. The amplifier includes first and second mirror circuits, each comprising an active transistor, a cascode transistor, and a base current compensating transistor. The cascode and active transistors are connected in series between an input node connected to the cascode transistor and a reference potential connected to the active transistor. A base of the cascode transistor is connected to a bias voltage, and the base current compensating transistor is connected between a supply voltage source and a base of the active transistor. A base of the base current compensating transistor is connected to the input node. A resistor is connected between the cascode and active transistors of the first and second mirror circuits. A first output circuit is connected to develop a first output signal in response to a current flowing of one of the active transistors. When an input current is applied between the input node and the supply voltage source of the first mirror circuit, and a first reference current is applied between the input node and the supply voltage source of the second mirror circuit, the first output signal has a logarithmic relationship to the input current.

The output circuit may be a first output transistor between a first output signal node and the reference potential having a base connected to the base of the active transistor of the second mirror circuit. Additionally, the circuit can also include a second output circuit that includes a third mirror circuit. The third mirror circuit has an active transistor, a cascode transistor, and a base current compensating transistor. The cascode and active transistors are connected in series between an input node connected to the cascode transistor and a reference potential connected to the active transistor. A base of the cascode transistor is connected to the base of the cascode transistor of the second mirror circuit, and the base current compensating transistor is connected between a supply voltage source and a base of the active transistor. A base of the base current compensating transistor is connected to the input node of the third mirror circuit. A second output transistor is connected between a second output signal node and the reference potential, having a base connected to the base of the active transistor of the third mirror circuit. When a second reference current is applied between the input node of the third mirror circuit and the supply voltage source, the first and second output signals are differential output signals.

All of the transistors may be bipolar transistors, and more specifically, NPN transistors. Additional reference current sources may also be connected respectively between the active and cascode transistors of the first, second, and third mirror circuits and the voltage supply source.

In accordance with another broad aspect of the invention, a logarithmic amplifier is presented that includes first and second mirror circuits. Each mirror circuit has an active transistor, a cascode transistor, and a base current compensating transistor. The cascode and active transistors are connected in series between a reference current input node connected to the cascode transistor and the reference potential connected to the active transistor. A base of the cascode transistor is connected to a bias voltage, and the base current compensating transistor is connected between a supply voltage source and a base of the active transistor. A base of the base current compensating transistor is connected to the reference current input node. A resistor is connected between the cascode and active transistors of the first and second mirror circuits. Third and fourth mirror circuits each have a mirror cascode transistor connected between a current input node and a floating output node, and having a base connected to the base of a respective one of the cascode transistors of the first and second mirror circuits. A mirror base current compensating transistor is connected between the supply voltage source and the base of the mirror cascode transistor, having a base connected to the current input node. The floating output nodes of the third and fourth mirror circuits are interconnected. A diode connected transistor is connected between the floating output nodes of the third and fourth mirror circuits and the reference potential. First and second output circuits are provided for developing first and second output signals in response to a current flowing of one of the active transistors. When an input current is applied between the input node and the supply voltage source of one of the third mirror circuit, and reference currents applied between input nodes and the supply voltage source of the first, second, and fourth mirror circuits, the first output signal has a logarithmic relationship to the input current.

In one embodiment, the first and second output circuits each have an output transistor between respective first and second output signal nodes and a reference potential, or ground, having a base connected to the base of a respective one of the active transistor of the first and second mirror circuits wherein the first and second output signals are differential currents.

In yet another broad aspect of the invention, an exponential converter is presented that has a first mirror circuit. The first mirror circuit has an active transistor, a cascode transistor, and a base current compensating transistor. The cascode and active transistors are connected in series between a reference current input node connected to the cascode transistor and a reference potential connected to the active transistor. A base of the cascode transistor is connected to a bias voltage, and the base current compensating transistor is connected between a supply voltage source and a base of the active transistor. A base of the base current compensating transistor is connected to the reference current input node. A second mirror circuit has an active transistor, a cascode transistor, and a base current compensating transistor. The cascode transistor, a resistor, and the active transistor are connected in series between a reference current input node connected to the cascode transistor and the reference potential connected to the active transistor. A base of the cascode transistor is connected to a bias voltage, and the base current compensating transistor is connected between a supply voltage source and a base of the active transistor. A base of the base current compensating transistor is connected to the reference current input node. The bases of the cascode transistors of the first and second mirror circuits are interconnected, and the base of the active transistor is connected to a base of an mirror transistor that is connected between the cascode transistor and the reference potential. An output circuit has an output transistor connected between a circuit output node and the active transistor of the second mirror circuit. The base of the output transistor is connected to the base of the cascode transistor of the second mirror circuit. When an input current is applied in parallel with the mirror transistor, and reference currents are applied to the reference current input nodes of the first and second mirror circuits with respect to the supply voltage source, an output signal at the circuit output node is an exponential function of the input current.

The input current may be the sum of a desired input current signal and a current that equal a saturation current of the active transistor of the second mirror circuit.

In still another broad aspect of the invention, an exponential converter is presented. The exponential converter has a first mirror circuit that has an active transistor, a cascode transistor, and a base current compensating transistor. The cascode and active transistors are connected in series between a reference current input node connected to the cascode transistor and a reference potential connected to the active transistor. The base current compensating transistor is connected between a supply voltage source and a base of the active transistor. A base of the base current compensating transistor is connected to the reference current input node. A second mirror circuit also has an active transistor, a cascode transistor, and a base current compensating transistor. The cascode and active transistors are connected in series between a reference current input node connected to the cascode transistor and the reference potential connected to the active transistor. The base current compensating transistor is connected between a supply voltage source and a base of the cascode transistor. A base of the base current compensating transistor is connected to the reference current input node, and the bases of the active transistors of the first and second mirror circuits are interconnected. A resistor is connected from the nodes between the cascode and active transistors of the first and second mirror circuits. An output circuit has a third mirror circuit that has an active transistor, a cascode transistor, and a base current compensating transistor. The cascode and active transistors are connected in series between a reference current input node connected to the cascode transistor and the reference potential connected to the active transistor. The base current compensating transistor is connected between a supply voltage source and a base of the cascode transistor, a base of the base current compensating transistor being connected to the reference current input node. The base of the cascode transistor is connected to a base of the cascode transistor of the first mirror circuit, and the base of the active transistor is connected to a node between the cascode transistor and the active transistor. An output transistor connected between an output node and the node between the cascode transistor and the active transistor, a base of the output transistor being connected to the base of the cascode transistor of the second mirror circuit. When a first differential input current is applied from the node between the cascode and active transistors of the first mirror circuit and the reference potential, a second differential input current is applied from the node between the cascode and active transistors of the second mirror circuit and the reference potential, and reference currents are applied to the reference current input nodes of the first and second mirror circuits with respect to the supply voltage source, an output signal at the circuit output node is developed as an exponential function of the input currents. The first and second differential input currents are respectively the sum of a current that equal a saturation current of the active transistor of the first mirror circuit and a desired input current signal, and the difference of a current that equal a saturation current of the active transistor of the second mirror circuit and the desired input current signal.

BRIEF DESCRIPTION OF THE DRAWINGS

The invention is illustrated in the accompanying drawings, in which:

FIG. 1 is an electrical schematic diagram of a circuit constructed in accordance with a preferred embodiment of the invention for performing logarithmic signal conversion.

FIG. 2 is an electrical schematic diagram of a circuit constructed in accordance with a preferred embodiment of the invention for performing logarithmic signal conversion.

FIG. 3 is an electrical schematic diagram of a differential output current mode, logarithmic amplifier, in accordance with a preferred embodiment of the invention.

FIG. 4 is an electrical schematic diagram of a current mode, exponential converter, having a single ended output, in accordance with a preferred embodiment of the invention.

And FIG. 5 is an electrical schematic diagram of a current mode exponential converter having a differential input, in accordance with a preferred embodiment of the invention.

In the various figures of the drawings, like reference numerals are used to denote like or similar parts.

DETAILED DESCRIPTION OF THE PREFERRED EMBODIMENTS

An electrical schematic diagram of a preferred embodiment 5 of the basic circuit from which the logarithmic and exponential converter circuits of the invention are based is shown in FIG. 1. The circuit 5 includes four NPN transistors Q0–Q3 and a resistor $R_o$. It should be noted that although the circuit embodiment 5 shown utilizes NPN type bipolar transistors, which is preferred, PNP transistors can be used to equal advantage with appropriate modification to the power supply and signal voltages. Transistor Q0 is referred to herein as a "cascode" transistor, transistor Q1 is referred to as an "active" transistor, and transistor Q2, is referred to as a "base current compensating" transistor.

In the embodiment 5 shown, an input current source $I_{IN}$ is connected between a $V_{cc}$ rail 6 and the collector of the cascode transistor Q0. The base of the cascode transistor Q0 is connected to a bias reference voltage, VB1, which can be, for example, $2V_{BE}$ above ground. A second bias reference voltage VB2 is applied to the resistor $R_o$. The value of the voltage VB2 can be, for example, VB1-$V_{be(Q2)}$ at $V_{be}0$. The emitter of the cascode transistor Q0 is connected to the collector of the active transistor Q1. The emitter of the active transistor Q1 is connected to a reference potential, or ground.

The base current base current compensating transistor Q2 has its collector connected to the $V_{cc}$ rail 6 and its emitter connected to the base of the active transistor Q1. The base current base current compensating transistor Q2 serves to provide a voltage level shift between the base of the active device Q1 and the collector of the cascode device Q0. In essence, the base current base current compensating device isolates the base of the active device Q1 with respect to the collector of the cascode transistor Q0. If desired, an additional level shifting voltage source, not shown, can be used for further voltage level translation, to specify the voltage on the collector of the transistor Q0. The base of the current base current compensating transistor Q2 is connected to the collector of the cascode transistor Q0.

A current output $I_{out}$ from the circuit 5 is developed by a mirror transistor Q3. The mirror transistor Q3 has its emitter connected to the reference potential and its collector connected to an output terminal 7. Its base is connected to the base of the active transistor Q1. Since the bases and emitters of transistors Q1 and Q3 are interconnected, the current that flows through the mirror transistor Q3 will necessarily copy or mirror the current flowing through the active transistor Q1, thereby providing an accurate current output from the circuit 5.

Thus, the transistors Q0, Q1, and Q2 are configured in such away that $I_{IN}$ always flows through the transistor Q0. The circuit embodiment 5 then performs a logarithmic signal conversion on an input current signal $I_{in}$, since the voltage produced across the resistor $R_o$ will be:

$$VB2 - \left[ VB1 - V_t \cdot \log\left( \frac{I_{IN}}{I_s 0} \right) \right]$$

where $I_s 0$ is the saturation current of the transistor Q0. Thus, the output current flowing through transistor Q3 contains the current through resistor $R_o$, which is a logarithmic function of the input current. It will be appreciated, of course, that additional circuitry or stages may be utilized to particular advantage to subtract or cancel any dc components that may exist in the output signal. More particularly, an electrical schematic diagram of an embodiment of a logarithmic amplifier 10 in accordance with the invention is shown in FIG. 2 and provides cancellation of the differential currents. The amplifier 10 includes three sections 11, 12, and 13, which are described in detail below.

The first section 11 is a cascoded current mirror input section in which transistor 15 is a cascode transistor, transistor 16 is an active transistor, and transistor 17 is a base current base current compensating transistor. A bias voltage VB is connected to the base of the cascode transistor 15. As before, the value of the reference voltage VB can be $2V_{be}$ above ground. The input current $I_{in}$ is connected between a $V_{cc}$ rail 20 and the collector of the cascode transistor 15.

The middle stage 12 is constructed similarly to the input stage 11, and includes three transistors 22, 23, and 24, that constitute, respectively, the cascode transistor, the active transistor, and the base current compensating transistor, thereby replicating the transistors of the input stage 11. A current reference I0 is connected between the $V_{cc}$ rail 20 and the collector of the cascode transistor 22. The base of the cascode transistor 22 of the second stage 12 is connected to the base of the cascode transistor 15 of the first stage 11. A resistor 26 of value R is connected between the emitters of the cascode transistors 15 and 22. The resistor R extracts the log of the input current, ratioed to I0, as follows:

$$V_{be(Q1)} = V_t \cdot \log\left(\frac{I_{in}}{I_s0}\right)$$

$$V_{be(Q2)} = V_t \cdot \log\left(\frac{I0}{I_s0}\right)$$

hence:

$$V_{be(Q2)} - V_{be(Q1)} = V_t \cdot \log\left(\frac{I0}{I_{in}}\right)$$

$$I_r = \frac{V_{e(Q2)} - V_{e(Q1)}}{R}$$

$$= V_t \cdot \frac{\log\left(\frac{I_{in}}{I0}\right)}{R}$$

$$(I-) = I_{ah} + V_t \cdot \frac{\log\left(\frac{I0}{I_{in}}\right)}{R} + I0$$

$$(I+) = I_{ah} + I0$$

Therefore:

$$I_{out} = (I+) - (I-)$$

$$= I_r$$

$$= V_t \cdot \frac{\log\left(\frac{I_{in}}{I0}\right)}{R}$$

Additionally, a current source $I_{a1}$ is connected between the $V_{cc}$ rail 20 and the collector of the mirror input transistor 16. In similar fashion, a current source $I_{ah}$ is connected between the $V_{cc}$ rail and the collector of the bottom mirror input transistor 23 of the middle stage 12. The current sources $I_{a1}$ and $I_{ah}$ serve to allow the absolute value of the current flowing in the resistor 26 to be larger than $I_{in}$ for values where $I_R$ is less than 0, or larger than I0 for values of $I_R$ greater than 0, within an adequate range for the application of concern, that is, $-I_{a1}$ less than $I_{out}$ less than I0 plus $I_{ah}$. It should be noted that $I_{out}$ can be negative.

The output stage 13 is constructed in a manner similar to that of the reference middle stage 12. More particularly, the output stage 13 includes a cascode transistor 30, an active transistor 31, and a base current base current compensating transistor 32. A current source I0 is connected between the $V_{cc}$ rail 20 and the collector of the cascode transistor 30. In addition, a current source $I_{ah}$ is connected between the $V_{cc}$ rail 20 and the collector of the active transistor 31. Finally, output transistors 35 and 36 are provided, connected to the respective differential output nodes 37 and 38. An output current, denoted I−, flows through the output transistor 35; additionally, an output current, denoted I+, flows through the output transistor 36. Furthermore, the transistors 30, 32, and 35 are constructed to essentially replicate the reference current mirror circuit 12. The replication of the current mirror circuit by the transistors 30, 32, and 35 causes the dc component $I_{ah}$ plus $I_0$ to cancel in the difference of the output currents, I+ minus I−.

It should be noted that as a result of the parasitic base and emitter resistors of the cascode transistor 15 that reduces the validity of the logarithmic relationship between VB1 and $I_n$, the circuit 10 is particularly well suited for operation at lower current values, down to very low sub-microampere values of the input current. Such non-linearity effects can be reduced, if necessary, by connecting several transistors in parallel with transistor 15, thereby attenuating the equivalent base and emitter series resistances.

It should also be noted that the circuit 10 in the embodiment illustrated is constructed entirely of NPN type transistors in a quasi open loop structure. Although other transistor types can be employed, the embodiment shown achieves optimum speed performance, a feature highly desirable in logarithmic amplifiers.

Moreover, in distinction to the presently required operational amplifier implementation with loop compensation using large capacitors which slow down the circuit and increase its size, the logarithmic amplifier of the invention can be fabricated with minimum space. Another important feature of the circuit 10 is that the negative as well as positive portions of the logarithmic function, that is, $I_{out}$ less than zero and $I_{out}$ greater than zero, can be realized. This is believed to be unique for an open loop logarithmic amplifier.

Finally, it should be noted that $I_{out}$ is insensitive to finite beta effects.

An electrical schematic diagram of a balanced embodiment 40 of a logarithmic amplifier constructed similarly to that described above with reference to FIG. 2 is shown in FIG. 3. The circuit embodiment 40 includes an input stage 11', a reference stage 12' and an output stage 13'. The input stage 11' has an additional mirror circuit that includes the active transistor 42 and a base current compensating transistor 43 connected between $V_{cc}$ and the base of the active transistor 42. The base of the transistor 43 is connected to the collector of the active transistor 42. The input current $I_{in}$ is applied to the collector of the active transistor 42 from $V_{cc}$. Similarly, the reference stage 12' has an additional mirror circuit that includes the active transistor 41 and a base current compensating transistor 44 connected between $V_{cc}$ and the base of the active transistor 41. The base of the transistor 44 is connected to the collector of the active transistor 41. The reference current I0 is applied to the collector of the active transistor 41 from $V_{cc}$.

In comparison to the FIG. 1 embodiment, the functions performed by the currents sources $I_{a1}$ and $I_{ah}$ in the circuit 10 of FIG. 1 are performed the circuit 40 by the two identical current sources $I_a$, one in the input section 11' and the other in the reference section 12'. Thus, the first current source $I_a$ is connected between the $V_{cc}$ rail 20 and the collector of the cascode transistor 22 of the half-cascode mirror that includes transistors 22, 23, and 24. Similarly, the second current source $I_a$ is connected between the $V_{cc}$ rail 20 and the collector of the cascode transistor 215 of the half-cascode mirror that includes transistors 15, 16, and 17.

The output section 13' includes a transistor 46 diode connected to the emitters of transistors 41 and 42. Additionally transistors 31 and 35 are provided between respective output nodes 48 and 49, with bases and emitters connected in parallel respectively with the bases and emitters of active transistors 16 and 23.

The balanced embodiment 40 has the bases of active transistors 15 and 22 driven by the respective signals at the bases of transistors 41 and 42. This allows the output currents I+ and I− to be balanced:

$$V_{be(Q9)} = V_t \cdot \log\left(\frac{I0}{I_s0}\right)$$

$$V_{be(Q10)} = V_t \cdot \log\left(\frac{I_{in}}{I_s0}\right)$$

$$V_{be(Q1)} = V_{be(Q2)}$$

hence:

$$I_r = \frac{(V_{e(Q2)} - V_{e(Q1)})}{R}$$

$$= \frac{(V_{b(Q10)} - V_{be(Q2)}) - (V_{b(Q9)} - V_{be(Q1)})}{R}$$

$$= \frac{V_{e(Q10)} - B_{b(Q9)}}{R}$$

$$= \frac{V_{be(Q10)} - V_{be(Q9)}}{R}$$

since:

$$V_{e(Q9)} = V_{e(Q10)}.$$

Therefore:

$$(I+) = I_a + I_r$$

and $$(I-) = I_a - I_r$$

with $$I_r = V_t \cdot \frac{\log\left(\frac{I_{in}}{R}\right)}{R}$$

which is a balanced differential output:

$$(I+)+(I-)=2I_a$$

and $$(I+)-(I-)=2I_r$$

It is noted that for the embodiments of the logarithmic converters shown, the input is single-ended and the output is differential. In the exponential converters next described, the input is differential (or single-ended bipolar), and the output is single-ended.

An electrical schematic diagram of an embodiment 50 of a circuit in accordance with the invention is shown in FIG. 4. The embodiment 50 can be used as an unbalanced exponential conversion circuit, and includes an input stage 51, a reference stage 52, and an output stage 53. The reference and output stages 52 and 53 are constructed similarly to the input and reference stages described above with respect to the logarithmic amplifier embodiment of FIG. 2, except the emitter of the base current compensating transistor 57 of the input stage 51 is connected to the emitter of the cascode transistor 55.

More particularly, the input stage 51 includes a cascode transistor 55, an active transistor 56, and a base current base current compensating transistor 57. A reference current I0 is connected in series between the $V_{cc}$ rail 58 and the collector of the cascode transistor 55. A current source 59 having a value of $I_a + I_{in}$ is connected between the reference potential and the collector of the active transistor 56.

The reference section 52 similarly contains three transistors 60, 61, and 62. The cascode transistor 61 is connected to a reference current source I0' between its collector and the $V_{cc}$ rail 58. The active transistor 62 is connected between the emitter of the cascode transistor 61 and a reference potential. The base current compensating transistor 60 is connected between the $V_{cc}$ rail 58 and the base of the active transistor 51, with its base connected to the collector of the cascode transistor 61.

The bases of the active transistors 56 and 62 are interconnected, so that the stages 51 and 52 complete the input section for the embodiment 50. The output stage 53, however, utilizes transistor 57 of the input stage 51 to provide drive current to the base of a lower transistor 65. An output transistor 66 is connected to an output node 68 through which the output current $I_{out}$ flows. The bases of the transistors 55, 61, and 66 are interconnected to a bias voltage VB, which, as described above, can be $2V_{be}$ above ground, or other desired voltage. Finally, a current source $I_{a1}$ is connected between the $V_{cc}$ rail 58 and the collector of the transistor 65, as shown.

A resistor 70 of value R is connected between the emitters of the cascode transistors 55 and the output transistor 66 through which a current, $I_r$, flows. The operation of the transistors 60, 61, and 62 serves to eliminate the DC component $I0-I_a$ from the input signal. Thus, only Iin flows through the resistor 70. Therefore, $I_r = I_{in}$, and from the same equations as set forth above:

$$I_{out} = I0 \cdot e^{\frac{R \cdot I_{in}}{V_t}}$$

It will be seen that the current source $I_{a1}$ establishes the limit for the negative values of $I_n$. Again, any portion of an exponential curve can be realized, provided $I_{a1}$ has been properly set.

An electrical schematic diagram of a balanced circuit embodiment 70 of an exponential converter circuit is shown in FIG. 4. The circuit 70 has a balanced input sections 71 and 72, and a reference section 73. The input section 72 of the circuit 70 is constructed with a cascode transistor 75 connected between a reference e current source $I_a$ and an active transistor 76. A base current compensating transistor 77 is connected between the $V_{cc}$ rail 78 and the base of the active transistor 76. The second input stage has an active transistor 80 connected in parallel with the active transistor 76 of the first input stage 72, and a cascode transistor 81 connected between a current source $I_a$ and the collector of the active transistor 80. The base current compensating transistor 82, however, is connected between the Vcc rail 78 and the base of the cascode transistor 81. A resistor 84 of value R through which a current $I_r$ flows is connected between the collectors of the active transistors 76 and 80.

A balanced current input to the circuit is applied between the respective collectors of the active transistors 76 and 80 and a reference potential. The current input connected to the collector of active transistor 76 is of value $I_s + I_{in}$, and the current input connected to the collector of active transistor 80 is of value $I_s - I_{in}$.

The reference section 73 includes a mirror transistor 86 connected to the Vcc rail by a reference current source I0. A base current compensating transistor 87 is connected between the Vcc rail 78 and the base of the mirror transistor 86. The base of the base current compensating transistor 87 is connected to the collector of the mirror transistor 86.

Additionally, the base of the mirror transistor is connected to the base of the cascode transistor 75 of the input stage 72. Finally, an output transistor 89 is diode connected between the emitter of the emitter transistor 86 and the reference potential.

The output current is derived from the circuit 70 via transistor 91 connected between an output node 92 and the collector of the transistor 89. The base of the output transistor 91 is connected to the base of the cascode transistor 81 of the input stage 71.

In operation:

$$V_{be(Q5)} = V_t \cdot \log\left(\frac{I0}{I_s 0}\right)$$

and $$V_{be(Q6)} = V_t \cdot \log\left(\frac{I_{out}}{I_s 0}\right)$$

and $$V_{be(Q1)} = V_{be(Q2)}$$

where $I_s 0$ is the saturation current of the transistor Q5 or Q6. Hence:

$$I_r = \frac{(V_{e(Q2)} - V_{e(Q1)})}{R}$$
$$= \frac{(V_{b(Q6)} - V_{be(Q2)}) - (V_{b(Q5)} - V_{be(Q1)})}{R}$$
$$= \frac{V_{e(Q6)} - B_{b(Q5)}}{R}$$
$$= \frac{V_{be(Q6)} - V_{be(Q5)}}{R}$$

since $V_{e(Q5)} = V_{e(Q6)}$
Due to the mirror transistors 76 and 80:
the sum of the currents at the emitter of transistor 55 are:
$I_a + I_r = I_s + I_{in} + I_{(Q3)}$, and the sum of the currents at the emitter of transistor 61 are: $I_a - I_r = I_s - I_{(Q3)}$, (since $I_{(Q3)} = I_{(Q3)}$).
Therefore, $I_r = I_{in}$, and $$I_{out} = I0 \cdot e^{\frac{R \cdot I_{in}}{V_t}}$$

and thus, $$I_{in} = \frac{(V_{be(Q6)} - V_{be(Q5)})}{R}$$

or $$I_{in} = V_t \cdot \frac{\log\left(\frac{I_{out}}{I0}\right)}{R}$$

or $$I_{out} = I0 \cdot e^{\left(\frac{R \cdot I_{in}}{V_t}\right)}$$

The balanced input $I_{in}$ can be positive or negative.

It will be appreciated that numerous changes can be made to the various circuit embodiments described above. For example, through the mere addition an a temperature compensating circuit in series with the input or output, the circuit can be easily compensated for temperature changes. One such circuit that can be used, for instance, is a well known Gilbert multiplier circuit. Other such circuits can be used as well.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A logarithmic amplifier comprising:

first and second mirror circuits, each comprising an active transistor, a cascode transistor, and a base current compensating transistor, the cascode and active transistors being connected in series between an input node connected to the cascode transistor and a reference potential connected to the active transistor, a base of the cascode transistor being connected to a bias voltage, and the base current compensating transistor being connected between a supply voltage source and a base of the active transistor, a base of the base current compensating transistor being connected to the input node;

a resistor connected between the cascode and active transistors of the first and second mirror circuits;

and a first output circuit for developing a first output signal in response to a current flowing of one of said active transistors said first output circuit comprising a first output transistor between a first output signal node and the reference potential, and having a base connected to the base of the active transistor of the second mirror circuit;

a second output circuit, said second output circuit comprising a third mirror circuit including:

an active transistor, a cascode transistor, and a base current compensating transistor, the cascode and active transistors being connected in series between an input node connected to the cascode transistor and a reference potential connected to the active transistor, a base of the cascode transistor being connected to the base of the cascode transistor of the second mirror circuit, and the base current compensating transistor being connected between a supply voltage source and a base of the active transistor, a base of the base current compensating transistor being connected to the input node of the third mirror circuit: and a second output transistor connected between a second output signal node and the reference potential, having a base connected to the base of the active transistor of the third mirror circuit, whereby when a second reference current is applied between the input node of the third mirror circuit and the supply voltage source, the first and second output signals are differential signals;

whereby when an input current is applied between the input node and the supply voltage source of the first mirror circuit, and a first reference current is applied between the input node and the supply voltage source of the second mirror circuit, the first and second output signals have a logarithmic relationship to the input current.

2. The logarithmic amplifier circuit of claim 1 further comprising two additional reference current sources connected respectively between the active and cascode transistors of the first and second mirror circuits and the voltage supply source.

3. The logarithmic amplifier circuit of claim 2 wherein the two additional reference current sources supply equal current values.

4. The logarithmic amplifier circuit of claim 1 wherein the first and second reference currents are equal.

5. The logarithmic amplifier circuit of claim 1 wherein the first and second output signals are differential currents.

6. The logarithmic amplifier circuit of claim 1 wherein all the transistors are bipolar transistors.

7. The logarithmic amplifier circuit of claim 1 wherein all of the transistors are NPN transistors.

8. The logarithmic amplifier circuit of claim 1 further comprising three additional reference current sources connected respectively between the active and cascode transistors of the first, second, and third mirror circuits and the voltage supply source.

9. The logarithmic amplifier circuit of claim 8 wherein the three additional reference current sources supply equal current values.

10. A logarithmic amplifier comprising:

first and second mirror circuits, each comprising an active transistor, a cascode transistor, and a base current compensating transistor, the cascode and active transistors being connected in series between a reference current input node connected to the cascode transistor and a reference potential connected to the active transistor, a base of the cascode transistor being connected to a bias voltage, and the base current compensating transistor being connected between a supply voltage source and a base of the active transistor, a base of the base current compensating transistor being connected to the reference current input node;

a resistor connected between the cascode and active transistors of the first and second mirror circuits;

third and fourth mirror circuits each comprising: a mirror cascode transistor connected between a current input node and a floating output node, and having a base connected to the base of a respective one of said cascode transistors of said first and second mirror circuits; a mirror base current compensating transistor connected between the supply voltage source and the base of the mirror cascode transistor, and having a base connected to the current input node; wherein the floating output nodes of said third and fourth mirror circuits are interconnected;

a diode connected transistor connected between the floating output nodes of the third and fourth mirror circuits and the reference potential;

and first and second output circuits for developing first and second output signals in response to a current flowing of one of said active transistors;

whereby when an input current is applied between the input node and the supply voltage source of one of the third mirror circuit, and reference currents applied between input nodes and the supply voltage source of the first, second, and fourth mirror circuits, the first output signal has a logarithmic relationship to the input current.

11. The logarithmic amplifier circuit of claim 10 wherein said first and second output circuits each comprise an output transistor between respective first and second output signal nodes and the reference potential, and having a base connected to the base of a respective one of the active transistor of the first and second mirror circuits.

12. The logarithmic amplifier circuit of claim 10 wherein the reference currents in the first and second mirror circuits are equal.

13. The logarithmic amplifier circuit of claim 10 wherein the first and second output signals are differential currents.

14. The logarithmic amplifier circuit of claim 10 wherein all of the transistors are bipolar transistors.

15. The logarithmic amplifier circuit of claim 10 wherein all of the transistors are NPN transistors.

16. An exponential converter comprising:

a first mirror circuit, comprising an active transistor, a cascode transistor, and a base current compensating transistor, the cascode and active transistors being connected in series between a reference current input node connected to the cascode transistor and a reference potential connected to the active transistor, and the base current compensating transistor being connected between a supply voltage source and a base of the active transistor, a base of the base current compensating transistor being connected to the reference current input node;

a second mirror circuit, comprising an active transistor, a cascode transistor, and a base current compensating transistor, the cascode and active transistors being connected in series between a reference current input node connected to the cascode transistor and the reference potential connected to the active transistor, and the base current compensating transistor being connected between a supply voltage source and a base of the cascode transistor, a base of the base current compensating transistor being connected to the reference current input node;

the bases of the active transistors of the first and second mirror circuits being interconnected;

and a resistor connected from nodes the cascode and active transistors of the first and second mirror circuits; and an output circuit comprising:

a third mirror circuit, comprising an active transistor, a cascode transistor, and a base current compensating transistor, the cascode and active transistors being connected in series between a reference current input node connected to the cascode transistor and a reference potential connected to the active transistor, and the base current compensating transistor being connected between a supply voltage source and a base of the cascode transistor, a base of the base current compensating transistor being connected to the reference current input node, the base of the cascode transistor being connected to a base of the cascode transistor of the first mirror circuit, and the base of the active transistor being connected to a node between the cascode transistor and the active transistor; and an output transistor connected between an output node and the node between the cascode transistor and the active transistor, a base of the output transistor being connected to the base of the cascode transistor of the second mirror circuit;

whereby when a first differential input current is applied from the node between the cascode and active transistors of the first mirror circuit and the reference potential, a second differential input current is applied from the node between the cascode and active transistors of the second mirror circuit and the reference potential, and reference currents are applied to the reference current input nodes of the first and second mirror circuits with respect to the supply voltage source, an output signal at the circuit output node is developed as an exponential function of the input currents.

17. The exponential converter of claim 16 wherein the first and second differential input currents are respectively the sum of a current that equal a saturation current of the active transistor of the first mirror circuit and a desired input current signal, and the difference of a current that equal a saturation current of the active transistor of the second mirror circuit and the desired input current signal.

18. The exponential converter of claim 17 wherein the reference currents in the first and second mirror circuits are equal.

19. The exponential converter of claim 17 wherein all of the transistors are bipolar transistors.

20. The exponential converter of claim 17 wherein all of the transistors are NPN transistors.

* * * * *